United States Patent
Yin et al.

(10) Patent No.: US 10,582,617 B2
(45) Date of Patent: Mar. 3, 2020

(54) METHOD OF FABRICATING A CIRCUIT MODULE

(71) Applicant: Intersil Americas LLC, Milpitas, CA (US)

(72) Inventors: Jian Yin, San Jose, CA (US); Nikhil Kelkar, Saratoga, CA (US); Loyde M. Carpenter, Jr., Palm Bay, FL (US); Nattorn Pongratananukul, San Jose, CA (US); Patrick J. Selby, Palm Bay, FL (US); Steven R. Rivet, Malabar, FL (US); Michael W. Althar, Melbourne, FL (US)

(73) Assignee: Intersil Americas LLC, Milpitas, CA (US)

( * ) Notice: Subject to any disclaimer, the term of this patent is extended or adjusted under 35 U.S.C. 154(b) by 216 days.

(21) Appl. No.: 15/656,916

(22) Filed: Jul. 21, 2017

(65) Prior Publication Data

US 2017/0325333 A1 Nov. 9, 2017

Related U.S. Application Data

(62) Division of application No. 13/536,827, filed on Jun. 28, 2012, now Pat. No. 9,717,146.

(Continued)

(51) Int. Cl.
*H05K 3/30* (2006.01)
*H05K 1/18* (2006.01)
(Continued)

(52) U.S. Cl.
CPC ......... *H05K 1/18* (2013.01); *H01L 23/49861* (2013.01); *H01L 25/16* (2013.01); *H01L 24/48* (2013.01); *H01L 24/49* (2013.01); *H01L 24/85* (2013.01); *H01L 2224/0603* (2013.01); *H01L 2224/48091* (2013.01);
(Continued)

(58) Field of Classification Search
CPC ..... H05K 1/18; H01L 23/49861; H01L 24/48; H01L 24/49; H01L 24/85; H01L 25/16
See application file for complete search history.

(56) References Cited

U.S. PATENT DOCUMENTS 4,966,646 A * 10/1990 Zdeblick .................. F15C 3/04
216/2
6,319,749 B1 11/2001 Shigeta et al.
(Continued)

FOREIGN PATENT DOCUMENTS

JP H10-163401 A 6/1998
JP 2000-277677 A 10/2000
(Continued)

*Primary Examiner* — Paul D Kim
(74) *Attorney, Agent, or Firm* — Foley & Lardner LLP

(57) ABSTRACT

A circuit module includes a plurality of electronic components and a single-layer conductive package substrate. The single-layer conductive package substrate is adapted to physically support and electrically interconnect the electronic components. The substrate has a peripheral portion and an interior portion. The peripheral portion includes a plurality of peripheral contact pads coupled to corresponding electronic components. The interior portion includes a plurality of floating contact pads that are electrically isolated from the peripheral contact pads and are coupled to corresponding electronic components.

15 Claims, 9 Drawing Sheets

Related U.S. Application Data

(60) Provisional application No. 61/650,308, filed on May 22, 2012.

(51) Int. Cl.
    *H01L 23/498*     (2006.01)
    *H01L 25/16*     (2006.01)
    *H01L 23/00*     (2006.01)

(52) U.S. Cl.
    CPC ............... *H01L 2224/48227* (2013.01); *H01L 2224/48247* (2013.01); *H01L 2224/48465* (2013.01); *H01L 2224/49111* (2013.01); *H01L 2224/49171* (2013.01); *H01L 2224/85444* (2013.01); *H01L 2924/00014* (2013.01); *H01L 2924/13091* (2013.01); *H01L 2924/181* (2013.01); *H01L 2924/19105* (2013.01); *H01L 2924/19107* (2013.01)

(56) References Cited

U.S. PATENT DOCUMENTS

| | | | |
|---|---|---|---|
| 6,737,153 B2 | 5/2004 | Suzumura et al. | |
| 6,930,377 B1 | 8/2005 | Bayan | |
| 7,271,037 B2 | 9/2007 | James | |
| 7,501,692 B2 | 3/2009 | Choi et al. | |
| 7,656,071 B2 * | 2/2010 | Mehta | H01G 5/18 310/324 |
| 7,663,211 B2 | 2/2010 | Noquil et al. | |
| 7,888,781 B2 | 2/2011 | Galera et al. | |
| 7,952,175 B2 | 5/2011 | Cho et al. | |
| 7,957,158 B2 | 6/2011 | Takakusaki et al. | |
| 8,198,711 B2 | 6/2012 | Sung et al. | |
| 2002/0037604 A1 | 3/2002 | Lee et al. | |
| 2006/0071310 A1 | 4/2006 | Choi et al. | |
| 2008/0192967 A1 * | 8/2008 | Chan | H01L 25/16 381/312 |
| 2009/0014854 A1 | 1/2009 | Cho et al. | |
| 2009/0026596 A1 | 1/2009 | Park et al. | |
| 2009/0283884 A1 | 11/2009 | Kang et al. | |
| 2010/0052118 A1 | 3/2010 | Galera et al. | |
| 2010/0109052 A1 | 5/2010 | Nakajima et al. | |
| 2010/0140773 A1 | 6/2010 | Galera et al. | |
| 2010/0224971 A1 | 9/2010 | Li | |
| 2010/0232131 A1 | 9/2010 | Qian et al. | |
| 2010/0297559 A1 | 11/2010 | Hata | |
| 2011/0023289 A1 | 2/2011 | Finn | |
| 2011/0292632 A1 | 12/2011 | Wen et al. | |
| 2012/0112331 A1 | 5/2012 | Kuo et al. | |
| 2012/0146205 A1 | 6/2012 | Fernando et al. | |
| 2017/0077361 A1 * | 3/2017 | Brandl | H01L 33/60 |

FOREIGN PATENT DOCUMENTS

| | | |
|---|---|---|
| JP | 2000-294713 A | 10/2000 |
| JP | 2002-134676 A | 5/2002 |
| JP | 2003-318347 A | 11/2003 |
| JP | 2006-108666 A | 4/2006 |
| JP | 2006-229160 A | 8/2006 |
| JP | 3911437 B2 | 2/2007 |
| JP | 3934820 B2 | 3/2007 |
| WO | WO-2006/071098 A1 | 7/2006 |
| WO | WO-2009/116632 A1 | 9/2009 |

* cited by examiner

METHOD OF FABRICATING A CIRCUIT MODULE

CROSS-REFERENCE TO RELATED APPLICATIONS

This application is a divisional of U.S. patent application Ser. No. 13/536,827, filed Jun. 28, 2012, now U.S. Pat. No. 9,717,146, which claims the benefit of and priority to U.S. Provisional Patent Application No. 61/650,308, filed May 22, 2012, which is incorporated in its entirety herein by reference.

TECHNICAL FIELD

The present embodiments relate generally to integrated circuits, and more specifically to the fabrication of circuit modules containing all required semiconductor dies and associated electronic components within a single package.

BACKGROUND

Multichip circuit modules or simply "circuit modules" are self-contained packages containing all semiconductor dies and other electronic components housed in the package. The package includes suitable electronic interconnection points, such as leads, lands, solder balls, etc., to enable the circuit module to be electrically and physically connected to another printed circuit board, such as a motherboard in a personal or tablet computer system or in a smart phone. A power module, for example, is a circuit module including all chips or dies (e.g., a controller die) and all other electronic components (e.g., power MOSFET transistors, phase inductors, and required resistive and capacitive components) housed together in a single package to form a desired type of power supply.

A circuit module includes some type of package substrate on which the semiconductor dies and other electronic components are mounted. The package substrate provides both for physical mounting and the electrical interconnection of the components. The type of package substrate utilized is typically determined based on a number of different factors, such as the cost of the package substrate, the wire or trace routing capability the package substrate must provide, and the thermal conductivity of the package substrate. For example, the package substrate could be a dual layered or even multilayered printed circuit board that would provide good routing capability for electrical interconnection of the components but would be relatively expensive and would not provide good thermal conductivity. This latter factor, thermal conductivity, is of particular concern in applications that dissipate a relatively large amount of power, such as where the circuit module is a power module. Where the power module is a switching regulator such as a DC-to-DC converter, the power MOSFET devices and inductors generate a relatively large amount of heat, and the thermal conductivity of the package substrate should be high enough to adequately dissipate this generated heat.

Existing power modules utilize a variety of different types of package substrates, each package substrate providing corresponding advantages and disadvantages in terms of the routing capability, thermal conductivity, and cost. Once such package substrate is a dual layered printed circuit board in a land grid array (LGA) power module. With such a dual layered printed circuit board, the routing capability to provide all the required electrical interconnections is good. The thermal conductivity, however, is undesirably low due to the relatively low thermal conductivity of the core material of the dual layered package substrate. Another approach is known as a quad flat no leads (QFN) power module in which the package substrate is a metal lead frame. In this approach, the metal lead frame provides very good thermal conductivity but relatively poor routing capability. To improve the routing capability of a QFN power module, another approach utilizes a tiny internal printed circuit board (PCB) to which controller and some resistive and capacitive components are directly coupled, with the internal PCB containing these components then being coupled to the metal lead frame. The internal PCB improves the routing capability among the resistive and capacitive components and the controller, and the thermal performance of such a module is good. The routing capability between power components not on the internal PCB remains poor, however, and the internal PCB also increases the cost. Yet another approach utilizes what is known as backside molding to cover portions of the bottom of the metal lead frame and provides more flexibility in the location of pads of the metal lead frame for interconnection to the printed circuit board to which the power module is attached. Due to the single metal lead frame this approach too suffers from relatively poor routing capability.

There is a need generally for improved circuit modules, and in particular improved power modules having good routing and thermal capabilities at a low cost of manufacture.

SUMMARY

One embodiment of the present disclosure is a circuit module including a plurality of electronic components and a single-layer conductive package substrate. The single-layer conductive package substrate is adapted to physically support and electrically interconnect the electronic components. The substrate has a peripheral portion and an interior portion. The peripheral portion includes a plurality of peripheral contact pads coupled to corresponding electronic components. The interior portion includes a plurality of floating contact pads that are electrically isolated from the peripheral contact pads and are coupled to corresponding electronic components. The circuit module is a power module in one embodiment.

According to another embodiment of the present disclosure, a method of fabricating a circuit module includes partially etching a first side of a single-layer conductive package substrate to form trenches in the first side of the single-layer conductive package substrate. The method further includes disposing a plurality of electrical components on the first side of the single-layer conductive package substrate. After disposing each electrical component on the first side of the single-layer conductive package substrate, the method includes etching back a second side of the single-layer conductive package substrate to reach each trench formed in the first side of the single-layer conductive package substrate.

DETAILED DESCRIPTION

Figure 1:
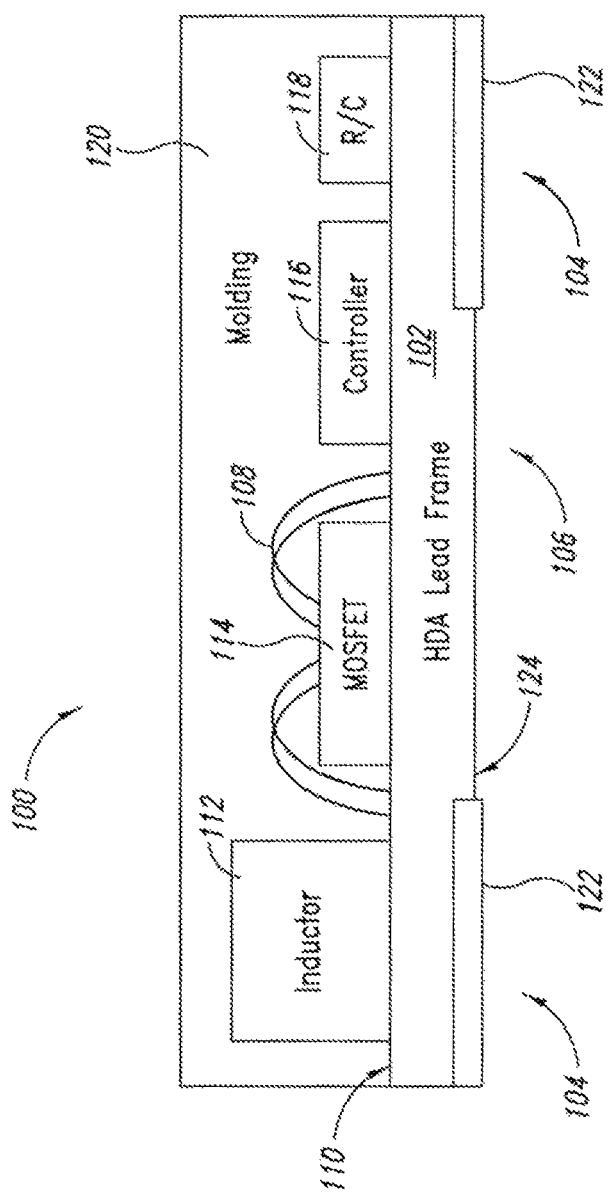
FIG. 1 is a cross-sectional view of a high-density lead frame array (HDA) power module including a high-density lead frame array (HDA) lead frame according to one embodiment.

FIG. 1 is a cross-sectional view of a high-density lead frame array (HDA) power module 100 including a single-layer conductive package substrate 102 in the form of a high-density lead frame array (HDA) lead frame according to one embodiment. The HDA lead frame 102 includes a peripheral portion 104 including peripheral contact pads (not shown) and an interior portion 106 including floating contact pads (not shown) that are electrically isolated from the peripheral contact pads. The peripheral and interior contact pads of the HDA lead frame 102 in combination with bond or jumper wires 108 allow the HDA power module 100 to provide good routing capabilities for interconnection of electrical components of the power module, and also provide good thermal conductivity to dissipate heat since the HDA lead frame is formed from a single conductive layer of material. This approach, although using the HDA lead frame 102 formed from a single conductive layer of material, provides routing capability similar to that of a dual-layered PCB while also providing good thermal performance, as will be explained in more detail below.

In the following description, certain details are set forth to provide a sufficient understanding of the present embodiments, but one skilled in the art will appreciate that the embodiments may be practiced without these particular details. Furthermore, one skilled in the art will appreciate that the example embodiments described below do not limit the scope of the present invention, and will also understand various modifications, equivalents, and combinations of the disclosed example embodiments and components of such embodiments are within the scope of the present invention. Illustrations of the various embodiments, when presented by way of illustrative examples, are intended only to further illustrate certain details of the various embodiments, and should not be interpreted as limiting the scope of the present invention. Finally, in other instances below, the operation of well-known components or processes have not been shown or described in detail to avoid unnecessarily obscuring the present invention.

In the embodiment of FIG. 1, the HDA power module 100 is a DC-to-DC converter and includes a number of electronic components mounted on an upper side or surface 110 of the HDA lead frame 102. More specifically, these electronic components include an inductor 112, power switching devices in the form of MOSFET drive transistors 114, a controller 116 for controlling the overall operation of the HDA power module 100, and miscellaneous electronic elements including resistive and capacitive (R/C) components 118. These 1 o electronic components 112-118 are encapsulated in a protective cover 120 formed from an insulating encapsulation material to protect the components once they are disposed on the upper surface 110 of the HDA lead frame 102 and the required jumper wires 108 have been connected between bonding pads (not shown) on the components and bonding pads (not shown) on the upper surface 11 O of HDA lead frame 102, as will be described in more detail below. The HDA power module 100 further includes insulating mask regions 122 formed over selected segments of a lower side or surface 124 of the HDA lead frame 102 to insulate these selected segments of the lower surface when the HDA power module is mounted to another external circuit board, such as a motherboard. Note that in the HDA power module 100 jumper wires 108 are shown electrically connecting the MOSFET drive transistors 114 to the HDA lead frame 102, but such jumper wires may of course be utilized to electrically connect other ones of the electronic components 112-118 to the HDA lead frame.

Figure 2:
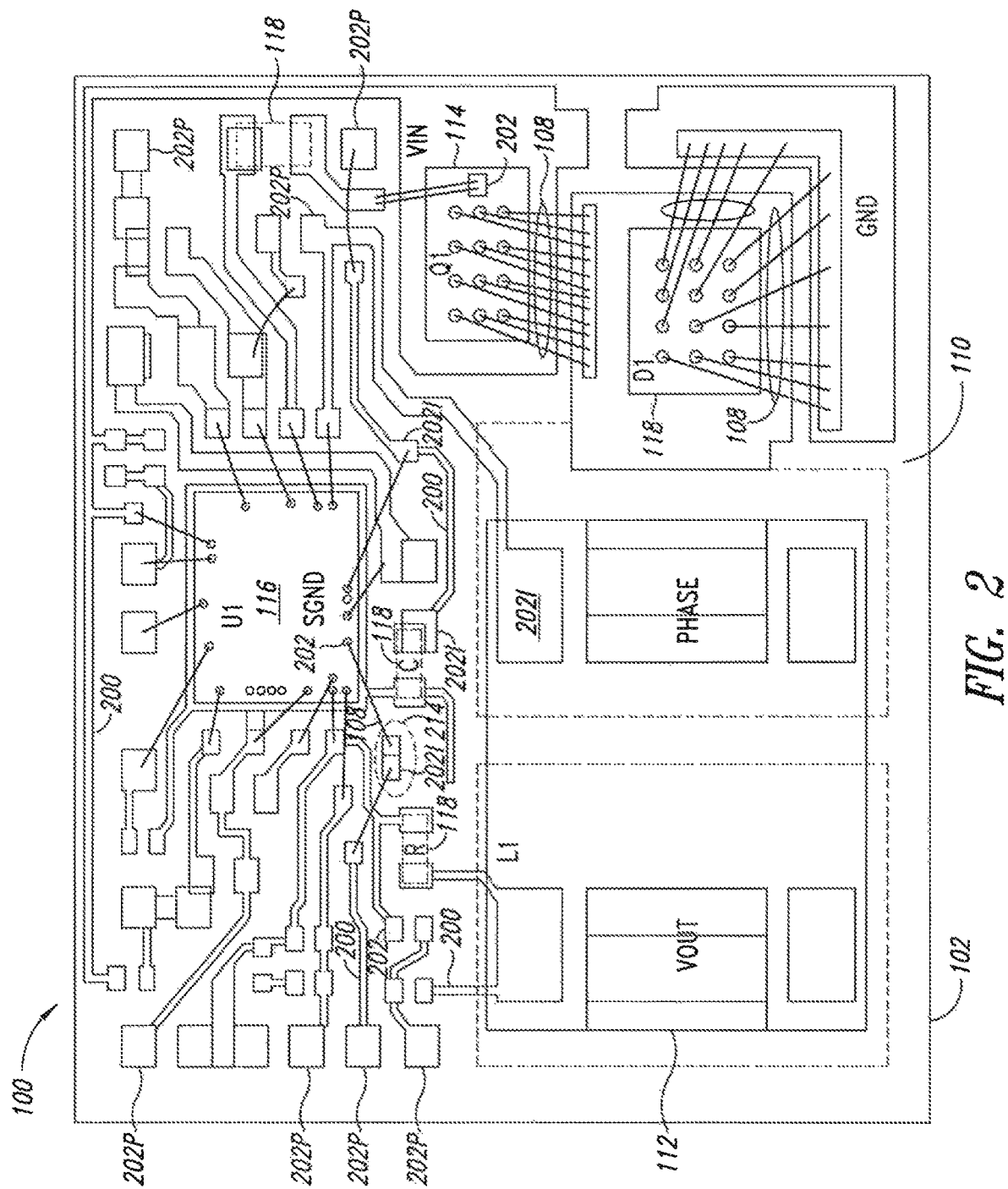
FIG. 2 is a top view the HDA power module of FIG. 1 illustrating the routing of traces of the HDA lead frame and jumper wires interconnecting components and connecting components to the HDA lead frame.

FIG. 2 is a top view the HDA power module 100 of FIG. 1 illustrating the routing of conductive traces 200 and bonding pads 202P and 202I of the HDA lead frame 102 and showing the jumper wires 108 providing additional connections of some of the electronic components 112-118 to the HDA lead frame. The bonding pads 202P correspond to bonding pads contained in the peripheral portion 104 of the HDA lead frame 102 while bonding pads 202I correspond to bonding pads contained in the interior portion 106 of the HDA lead frame. The electronic components 112-118 are also illustrated in the figure. More specifically, the inductor 112 is represented through the box in the lower left portion of FIG. 2 and the controller 116 shown in the upper center of the figure. The MOSFET drive transistors 114 are shown in the center-right of the figure and diodes that are part of the miscellaneous components 118 (FIG. 1) are shown in the lower right of the figure.

Some of the electronic components 112-118, such as the controller 116, power MOSFET drive transistors 114, and diodes that are part of the components 118 are shown as including bonding pads 202 to which one end of a jumper wire 108 is attached, with the other end of the jumper wire then being attached to a bonding pad 202P or 202I on the HDA lead frame 102. For example, as seen just to the left and below the controller 116 in the figure a dotted line 204 surrounds an interior bonding pad 202I to which one end of a jumper wire 108 is attached and the other end of the jumper wire is attached to a bonding pad 202 on the controller. This connection also illustrates the routing flexibility of the HDA lead frame 102, with an interior bonding pad 202I being used in combination with jumper wires 108 to connect the bonding pad 202 on the controller 116 to a peripheral bonding pad 202P. This connection is accomplished via a first jumper wire 108 from the bonding pad 202 on the controller 116 to the interior bonding pad 202I surrounded by dotted line 204 and then a second jumper wire 108 connected from this bonding pad to another bonding pad that is then connected through a conductive trace 200 to a peripheral bonding pad 202P. As seen in FIG. 2, although the HDA lead frame 102 is made of only a single layer of conductive material, the dual partial-etch and etch-back process through which the HDA lead frame is fabricated, which will be described in more detail with reference to FIGS. 5A-5H, in combination with the jumper wires 108 provide good routing capability for interconnecting all the electronic components 112-118.

Figure 3:
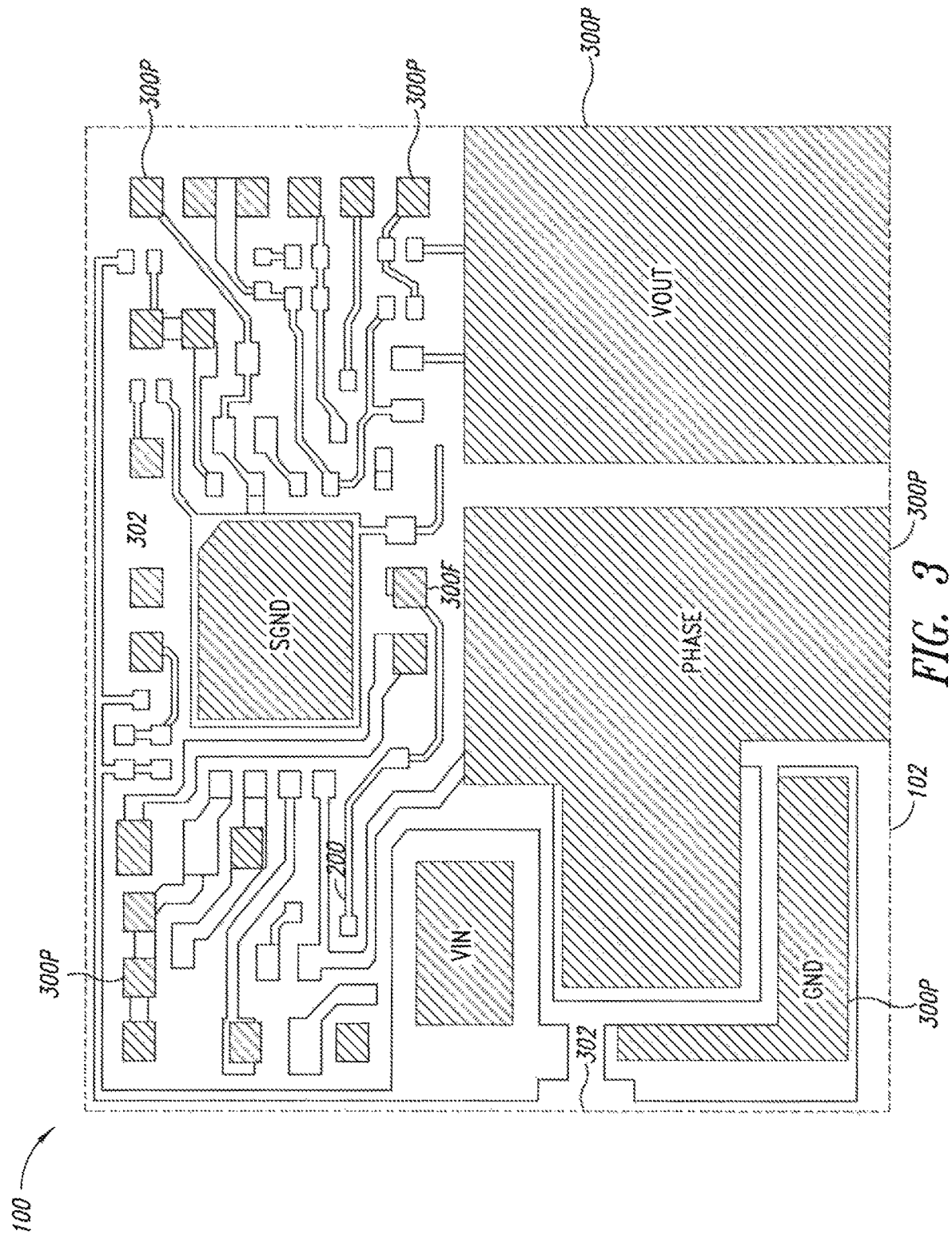
FIG. 3 is a bottom view illustrating the lower surface of the HDA lead frame of the HDA power module of FIG. 1 and illustrates exposed peripheral and floating contact pads along with solder mask regions on the lower surface of the HDA lead frame.

FIG. 3 is a bottom view illustrating the lower surface 124 of the HDA lead frame 102 of the HDA power module 100 of FIG. 1. The figure illustrates exposed peripheral contact pads 300P and interior or "floating" contact pads 300F. Solder mask regions 302 are formed on the lower surface 124 of the HDA lead frame 102 to insulate selected conductive traces 200 and bonding pads 202I, 202P. Note that as used in the present description the term "bonding pad" of the HDA lead frame 102 corresponds to such a structure on the upper surface 110 of the HDA lead frame while the terms peripheral or floating "contact pads" 300P, 300F refer to such a structure on the lower surface 124 of the HDA lead frame 102. The floating contact pads 300F are contact pads that are not connected to or are electrically isolated from any peripheral contact pads 300P of the HDA lead frame 102, such as the floating contact pads 300F to the right in the upper center of FIG. 3.

In FIG. 3 the black portions correspond to exposed portions of the lower surface 124 of the HDA lead frame 102 and in this way form the contact pads 300, whether they are floating contact pads 300F or peripheral 25 contact pads 300P. The HDA lead frame 102 and thereby the HDA power module 100 is electrically connected to an external circuit board (not shown) through the contact pads 300F, 300P. Note the different sizes of the contact pads 300F, 300P are determined, at least in part, by current carrying or power requirements of the contact pads. Thus, peripheral contact pads 300P such as those shown in the upper right of FIG. 3 are associated with control signals of the controller 116 and are thus low-power a load current signals and accordingly these peripheral contact pads a relatively small. In contrast, as shown in the lower left of FIG. 3 the peripheral contact pad 300P labeled ground (GNO) is associated with the diodes that are part of electronic components 118 (see FIG. 2) and the exposed portion of the lower surface 124 is larger. The same is true of the peripheral contact pad 300P labeled "PHASE" in the lower-middle-class lower-left of FIG. 3 where this exposed portion of the lower surface 124 is relatively large due to its relatively high current requirements, as will be discussed in more detail below with reference to FIG. 4.

The light-shaded portions of FIG. 3 correspond to the solder mask regions 302 that are formed on the lower surface 124 of the HDA lead frame 102 to insulate selected conductive traces 200 and bonding pads 202I, 202P and contact pads 300F, 300P. The solder mask regions 302 correspond to the insulating mask regions 122 shown in FIG. 1. In this way, the solder mask regions 302 are formed to expose selected regions of the lower surface 124 of the HDA lead frame 102 and in this way define or form the peripheral and floating contact pads 300P, 300F. FIG. 3 thus illustrates that the HDA lead frame 102 enables the HDA power module 100 (FIG. 1) to include both peripheral contact pads 300P and floating contact pads 300F, which provides improved routing capabilities as discussed above with reference to FIGS. 1 and 2.

Figure 4:
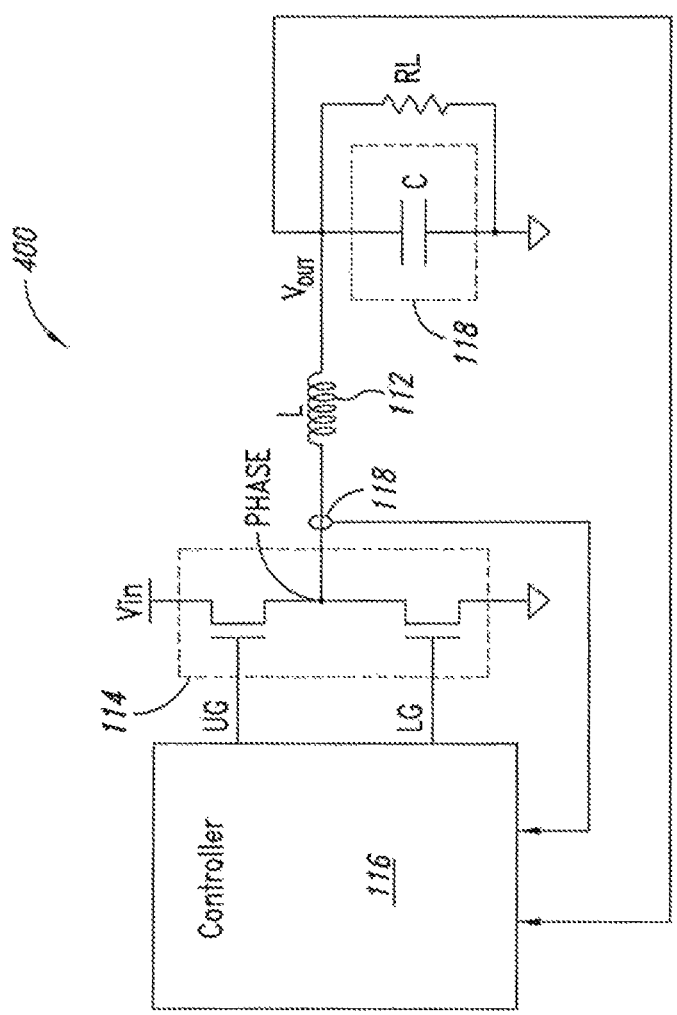
FIG. 4 is a simplified schematic and functional block diagram of a conventional Buck DC-to-DC converter that is contained in the HDA power module of FIG. 1 according to one embodiment.

FIG. 4 is a simplified schematic and functional block diagram of a conventional Buck DC-to-DC converter 400 that is contained in the HDA power module 100 of FIGS. 1-3 according to one embodiment. The electronic components 112-118 are identified with their appropriate electronic symbols in FIG. 4. One skilled in the art will understand the operation of the Buck DC-to-DC converter 400 and thus its operation will not be described in detail in the present description. Briefly, the controller 116 generates upper-gate UG and lower-gate LG control signals to control the switching ON and OFF of MOSFET drive transistors 114 to thereby store energy in and release energy from the inductor 112. The energy released from the inductor 112 generates an output voltage Vout and output current that are supplied to provide power to a load, which is represented by a resistor RL. The phase node PHASE corresponds to the node shown in FIG. 4. Note that a current sensor represented by the dotted line at the phase node PHASE is one of the electronic components 118 (FIG. 1) and detects current flowing through the inductor 112, which the controller 116, in turn, utilizes in controlling the overall operation of the converter 400.

Figure 5A:
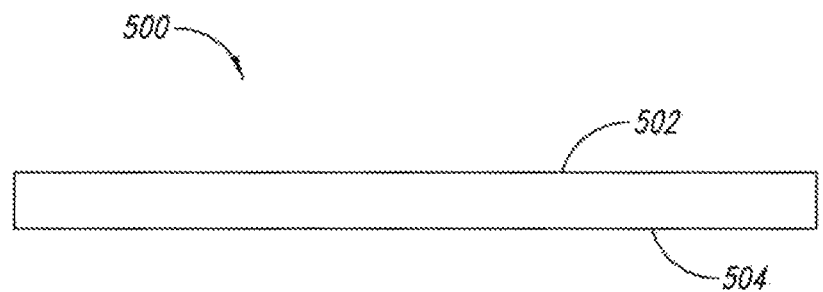
FIGS. 5A-5H are cross-sectional views illustrating a fabrication process for manufacturing the HDA power module of FIG. 1 according to one embodiment.
Figure 5B:
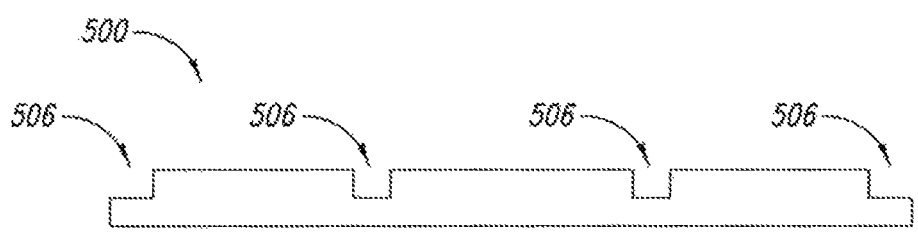
Figure 5C:
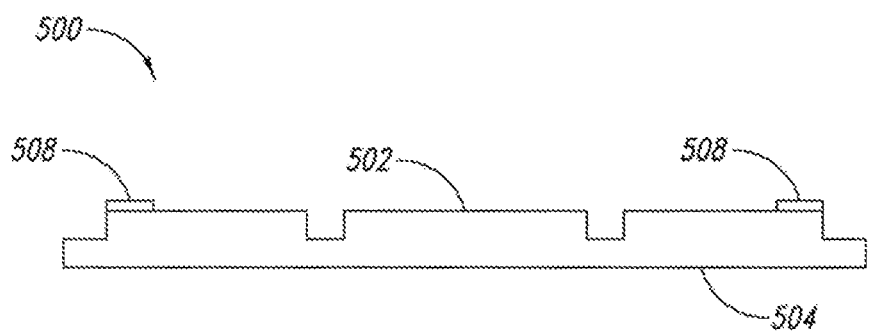

FIGS. 5A-5H are cross-sectional views illustrating a fabrication process for manufacturing the HDA power module 100 of FIG. 1 according to one embodiment. FIG. 5A illustrates a single-layer conductive package substrate 500 that is utilized in forming the HDA lead frame 102 (FIG. 1). In one embodiment, the single-layer conductive package substrate 500 is copper. The single-layer conductive package substrate 500 includes a first side or surface 502 and a second side or surface 504. As shown in FIG. 5B, an initial step of the process is a partial-etch of the first surface 502 of the substrate 500 to form etched regions or trenches 506 in the first surface of the substrate. After formation of the trenches 506, selected portions of the first surface 502 are then selectively plated to form the desired bonding pads 508. These selectively plated portions or bonding pads 508 are formed from a suitable conductive material, such as gold.

Figure 5D:
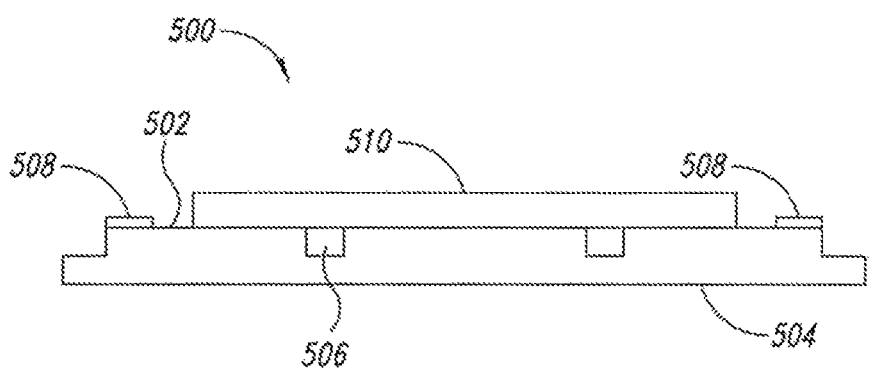

Once the selected portions of the upper surface 502 of the substrate 500 have been selectively plated to form bonding pads 508, electronic components 510 are disposed or placed on the upper surface in their required positions as seen in FIG. 5D. Disposing the electronic components 510 on the upper surface 502 includes electrically connecting the electronic components to the proper bonding pads 508 (not shown in FIG. 5D) and, when required, physically attaching the electronic components to the upper surface. Note that at this point the electronic components 510 cover portions of at least some of the trenches 506 formed in the upper surface 502 of the substrate 500. The electronic components 510 correspond to the electronic components 112-118 previously described with reference to the HDA power module 100 of FIG. 1, or whatever electronic components are required for the HDA power module being fabricated. The electronic components 510 are represented as a single box in FIG. 5D merely to simplify the figure and the present description.

Figure 5E:
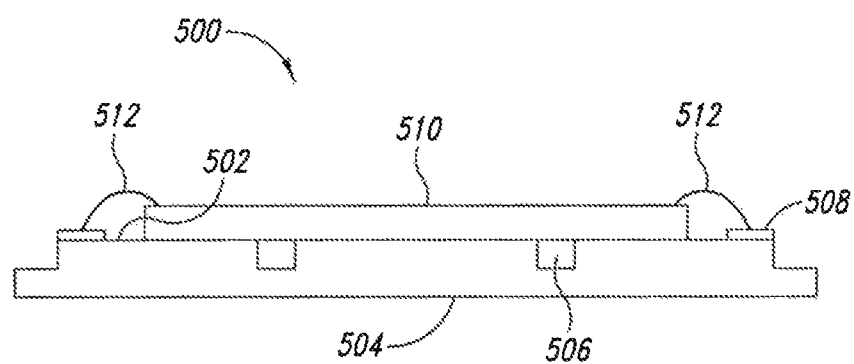
Figure 5F:
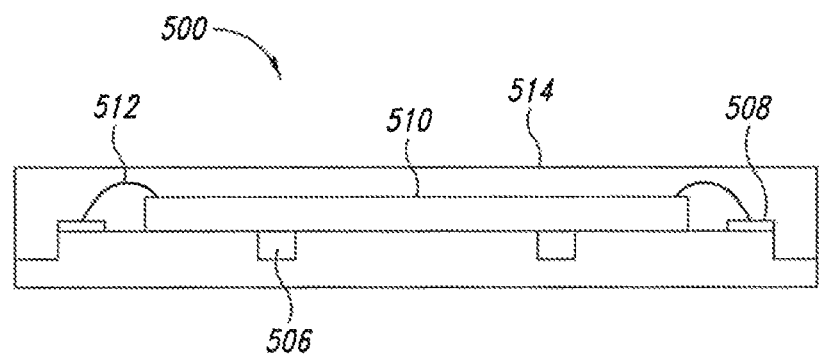

Once the electronic components 510 are disposed on the upper surface 502 of the substrate 500, the electronic components are wire bonded to the bonding pads 508 through bonding wires 512 as illustrated in FIG. 5E. These bonding wires 512 correspond to the jumper wires 108 in the embodiment of FIG. 1. After all the required bonding wires 512 have been attached, the structure of FIG. 5E is encapsulated as seen in FIG. 5F to form a protective cover 514 over and protect the electronic components 510 and bonding wires 512. The protective cover 514 is formed from a suitable insulating encapsulation material, such as epoxy. Note that as shown in FIG. 5F, during this encapsulation process the trenches 506 formed in the upper surface 502 of the substrate 500 are also filled with the encapsulation material. In some embodiments the partial etching of the upper surface 502 of the substrate 500 is done such that the trenches 506 formed through this partial etching are suitably sized to allow the encapsulation material to fill the trench even when a relatively large component is covering the trench, such as in the case of the inductor 112 (see FIGS. 2-3).

Figure 5G:
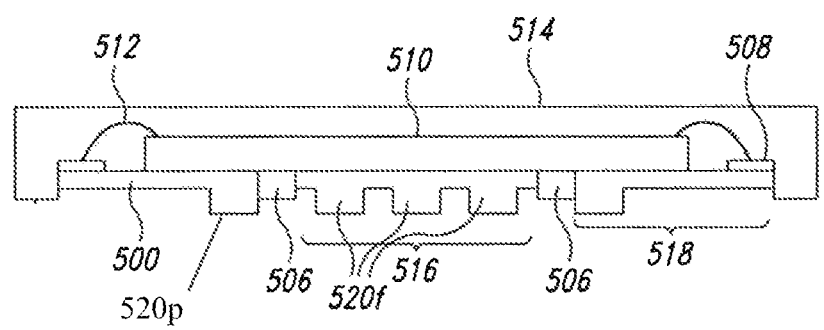

The encapsulation material filling the trenches 506 provides stability to the structure during the etch-back process illustrated in FIG. 5G. During the etch-back process, the second surface 504 of the substrate 500 is etched until the encapsulation material filling the trenches 506 is exposed, as seen in FIG. 5G. In this way conductive traces 200 and the bonding pads 202 as seen and discussed with reference to FIG. 2 are isolated as desired 15 provide the required electrical interconnections of the HDA lead frame being formed. FIG. 5G illustrates the two encapsulation-material filled trenches 506 after the etch-back process and shows how these two trenches isolate an interior portion 516 of the substrate 500 from exterior portions 518 of the substrate. The indentations shown in the interior portion 516 are merely intended to represent that during the etch-back process the desired bonding pads and conductive traces in this interior portion are formed and are isolated via the trenches 506 from similar bonding pads and conductive traces in the exterior portions 518 of the substrate 500. At this point, required floating contact pads 520F and peripheral contact pads 520P have been formed from the substrate 500.

Figure 5H:
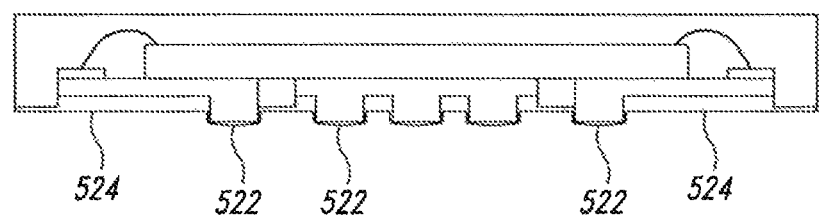

FIG. 5H illustrates the final packaging portion of the process in which desired floating and peripheral contact pads 520F, 520P may be either plated 522 with a suitable material, such as Nickel-Palladium-Gold (NiPdAu), or have a suitable solder coating applied to the contact pads for subsequent attachment of the HDA power module to an external circuit board. Also as part of this final packaging portion of the process a non-conductive or masking coating 524 is applied to desired portions of the substrate 500. This masking coating corresponds to the solder mask regions 302 previously described with reference to FIG. 3. At this point, fabrication of the HDA power module is complete and the module is ready for connection to an external circuit board.

Figure 6:
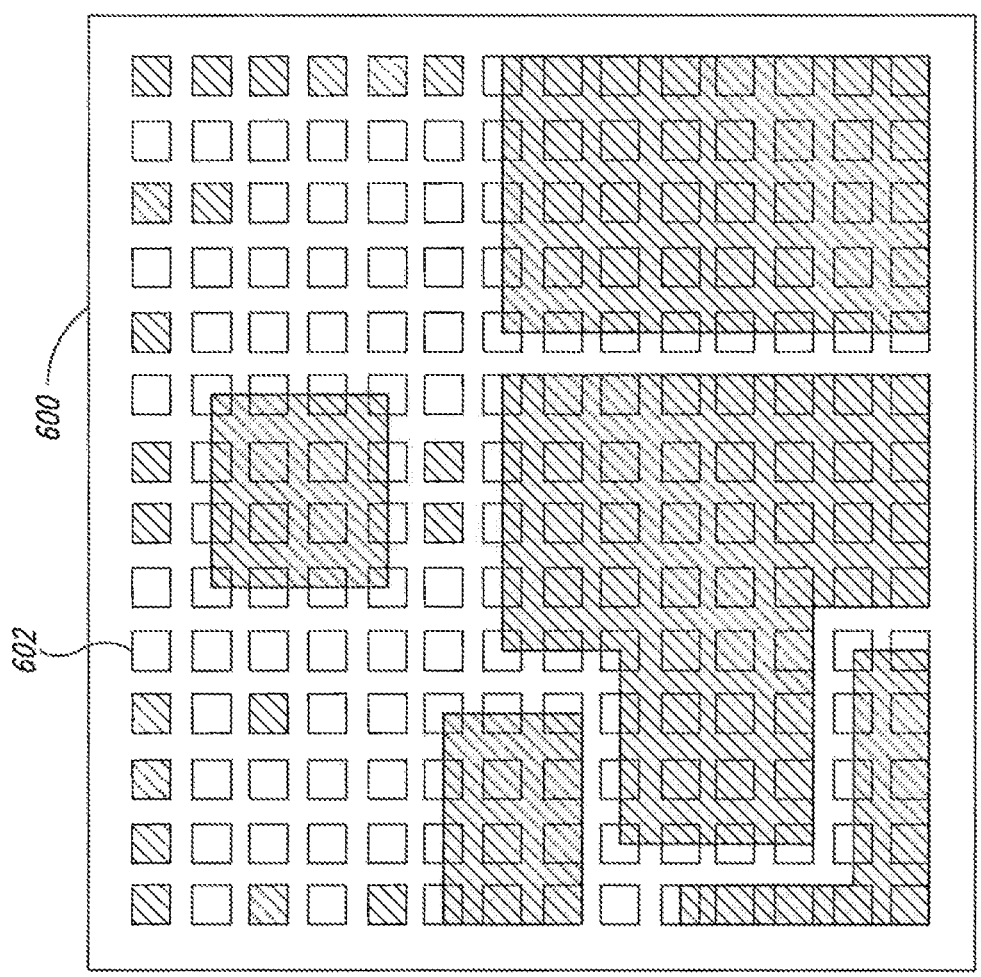
FIG. 6 is an example of a pitch-grid template that can be utilized to layout the location of contact pads on the HDA lead frame of the HDA power module of FIG. 1 according to one embodiment.

FIG. 6 is an example of a pitch-grid template 600 that can be utilized to layout the location of contact pads on the HDA lead frame 102 of the HDA power module 100 of FIG. 1 according to one embodiment of the present embodiments. This pitch-grid template 600 can be used to layout the location of the desired contact pads, floating and peripheral, on the lead frame 102 such that there is a desired minimum pitch between the contact pads. In one embodiment the minimum pitch is 1 mm. As seen in FIG. 6, the larger contact pads (see FIG. 3) correspond to multiple minimum individual contact pads represented by squares 602, while the minimum individual contact pads are defined by one of the squares 602 in the template 600.

Figure 7:
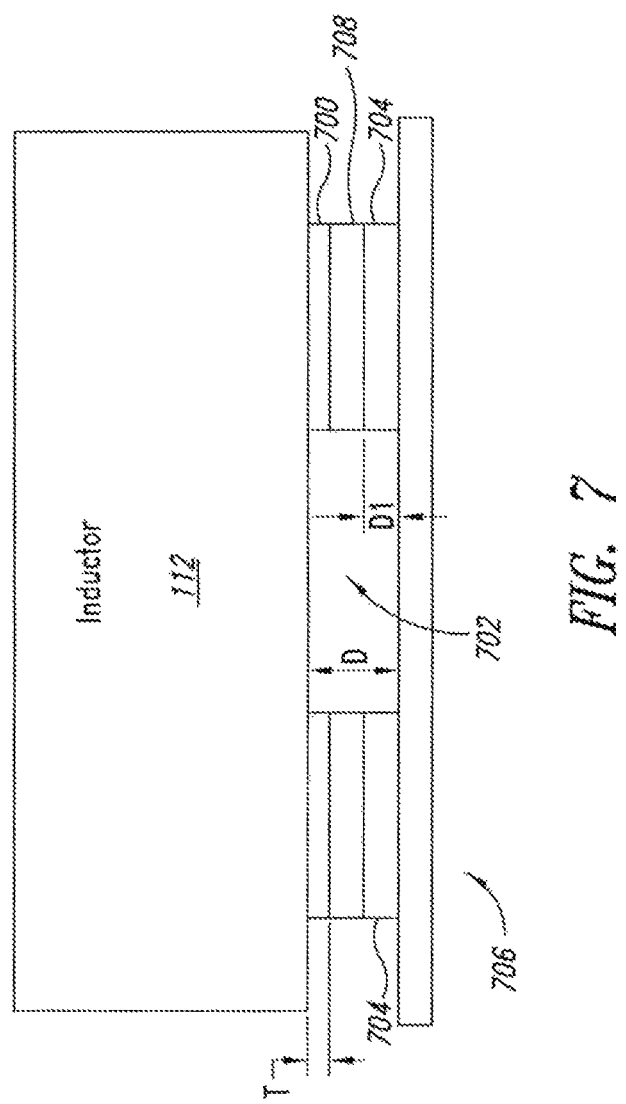
FIG. 7 illustrates an embodiment of the HDA lead frame of FIG. 1 in which partially etched trenches formed in the HDA lead frame have an increased effective depth to better enable the trenches to be filled with an encapsulation material according to one embodiment.

FIG. 7 illustrates an embodiment of the HDA lead frame 102 of FIG. 1 in which partially etched trenches formed in the substrate 500 have an increased effective depth to better enable these trenches to be filled with encapsulation material during the encapsulation process of FIG. 5F. The effective depth of the partially etched trenches 506 is increased through proper placement of larger components, such as the inductor 112 or the MOSFET drive transistors, so that encapsulation material betters fills the trenches during the encapsulation process. A larger component such as the inductor 112 typically has leads or terminals 700 having a thickness T that effectively increases a depth D of the trench 702 formed under the inductor 112. Through proper formation of bonding pads 704 on an HDA lead frame 706, the thickness T of the terminals 700 adds to a depth D1 of the trenches 702 formed in the HDA lead frame 706 through the partial etch process discussed with reference to FIG. 5B above. A solder attachment region 708, such as plating of the bonding pads 704 as discussed above with reference to FIG. 5C, also effectively increases the depth 0 of the trench 702. In this way, the trench 702 having the larger depth D (D>D1) will be better filled with encapsulation material as desired during the encapsulation process previously discussed with reference to FIG. 5F. Given the size of the terminals 700 the bonding pads 704 could be viewed as being bonding traces (see FIG. 2, lower left, where the size of the bonding pads associated with the inductor 112 are seen to be relatively large. Forming these relatively large bonding pads 704 to have approximately the width as the terminals 700 as seen in FIG. 7 helps prevent short circuits that could result during soldering of the terminals 700 to the bonding pads 704. If the bonding pads 704 had a width (horizontal dimension of the pads in FIG. 7) that was greater than that of the terminals 700, then solder and solder paste may spread out on the wider bonding pads, which could result in solder flowing off the bonding pads and causing unwanted short circuits.

Figure 8:
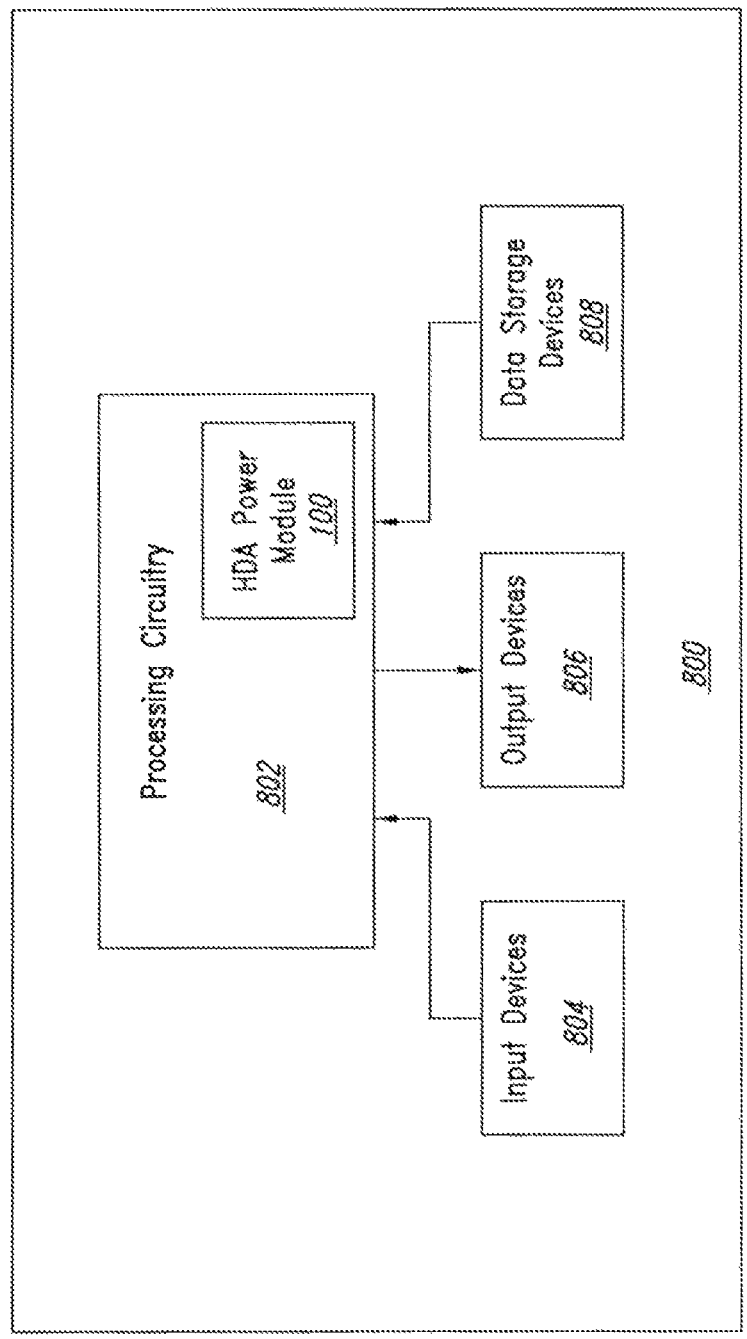
FIG. 8 is a functional block diagram of an electronic system including the HDA power module of any of FIGS. 1-7 according to another embodiment.

FIG. 8 is a functional block diagram of an electronic system 800 including processing circuitry 802 containing one or more of the embodiments of the HDA power module 100 described above with reference to FIGS. 1-7 according to another embodiment. The processing circuitry 802 includes circuitry for performing various functions, such as executing specific software to perform specific calculations or controlling the system 800 to provide desired functionality. In addition, the electronic system 800 includes one or more input devices 804, such as a keyboard, mouse, touch screen, audible or voice recognition component, and so on coupled to the processing circuitry 802 to allow an operator to interface with the electronic system. Typically, the electronic system 800 also includes one or more output devices 806 coupled to the processing circuitry 802, where the output devices can include a printer, video display, audio output components, and so on. One or more data storage devices 808 are also typically coupled to the processing circuitry 802 to store data or retrieve data from storage media (not shown). Examples of typical data storage devices 808 include magnetic disks, FLASH memory, other types of solid state memory, tape drives, optical disks like compact disks and digital video disks (DVDs), and so on.

Many of the specific details of certain embodiments are set forth in the above description and accompanying figures to provide a thorough understanding of such embodiments. One skilled in the art will understand, however, that the present invention may be practiced without all of the details described above. Moreover, in the above description one skilled in the art will understand that the figures related to the various embodiments are not to be interpreted as conveying any specific or relative physical dimensions, and also that specific or relative physical dimensions, if stated, should not to be considered limiting unless the claims expressly state otherwise. Further, illustrations of the various embodiments when presented by way of illustrative examples are intended only to further illustrate certain details of the various embodiments, and should not be interpreted as limiting the scope of the invention as set forth by the claims.

What is claimed is:

1. A method of fabricating a circuit module, comprising:
partially etching a first side of a single-layer conductive package substrate to form trenches in the first side of the single-layer conductive package substrate;
disposing a plurality of electrical components on the first side of the single-layer conductive package substrate, wherein disposing the plurality of electrical components includes causing the plurality of electrical components to be disposed over, but not within, any of the trenches; and after disposing each electrical component on the first side of the single-layer conductive package substrate, etching back a second side of the single-layer conductive package substrate to reach each trench formed in the first side of the single-layer conductive package substrate.

2. The method of claim 1, further comprising selectively plating portions of the first side of the single-layer conductive package substrate prior to disposing the electrical components on the first side.

3. The method of claim 2, wherein selectively plating portions of the first side of the single-layer conductive package substrate comprises selectively plating portions of the first side with gold.

4. The method of claim 2, further comprising, after disposing the electrical components on the first side of the single-layer conductive package substrate, attaching bond wires between the selectively plated portions of the first side of the single-layer conductive package substrate and bonding pads on the electrical components.

5. The method of claim 1, further comprising encapsulating the electrical components disposed on the first side of the single-layer conductive package substrate with an insulating encapsulation material.

6. The method of claim 5, further comprising attaching bond wires between bonding pads on selected electrical components.

7. The method of claim 5, wherein encapsulating the electrical components includes filling the trenches formed in the first side of the single-layer conductive package substrate with the insulating encapsulation material; and wherein etching back the second side of the single-layer conductive package substrate to reach each trench formed in the first side of the single-layer conductive package substrate comprises etching back the second side of the single-layer conductive package substrate to reach the insulating encapsulation material filling each trench formed in the first side of the single-layer conductive package substrate.

8. The method of claim 5, wherein the insulating encapsulating material comprises epoxy.

9. The method of claim 5, wherein encapsulating the electrical components with the epoxy includes causing the epoxy to fill the trenches such that bottom portions of all of the trenches are separated from the electrical components by the epoxy.

10. The method of claim 1, wherein the circuit module is a power module, and wherein the plurality of electrical components includes a controller die.

11. The method of claim 1, wherein the circuit module is a power module, and wherein the plurality of electrical components includes a power MOSFET.

12. The method of claim 1, wherein the circuit module is a power module, and wherein the plurality of electrical components includes a resistor.

13. The method of claim 1, wherein the circuit module is a power module, and wherein the plurality of electrical components includes a capacitor.

14. The method of claim 1, wherein the single-layer conductive package substrate comprises a single layer of copper.

15. A method of fabricating a circuit module comprising:
partially etching a first side of a single-layer conductive package substrate to form trenches in the first side of the single-layer conductive package substrate;
disposing a plurality of electrical components on the first side of the single-layer conductive package substrate;
after disposing each electrical component on the first side of the single-layer conductive package substrate, etching back a second side of the single-layer conductive package substrate to reach each trench formed in the first side of the single-layer conductive package substrate;
encapsulating the electrical components disposed on the first side of the single-layer conductive package substrate with an insulating encapsulation material,
wherein encapsulating the electrical components includes filling the trenches formed in the first side of the single-layer conductive package substrate with the insulating encapsulation material, and
wherein etching back the second side of the single-layer conductive package substrate to reach each trench formed in the first side of the single-layer conductive package substrate comprises etching back the second side of the single-layer conductive package substrate to reach the insulating encapsulation material filling each trench formed in the first side of the single-layer conductive package substrate;
plating selected portions of the second side of the single-layer conductive package substrate; and
forming insulating mask regions on selected portions of the second side of the single-layer conductive package substrate.

* * * * *